(12) United States Patent
Tailliet

(10) Patent No.: US 8,964,471 B2
(45) Date of Patent: Feb. 24, 2015

(54) SECURE MEMORY WHICH REDUCES DEGRADATION OF DATA

(71) Applicant: STMicroelectronics (Rousset) SAS, Rousset (FR)

(72) Inventor: Francois Tailliet, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 79 days.

(21) Appl. No.: 13/668,448

(22) Filed: Nov. 5, 2012

(65) Prior Publication Data

US 2013/0114340 A1 May 9, 2013

(30) Foreign Application Priority Data

Nov. 7, 2011 (FR) ...................... 11 60060

(51) Int. Cl.
| | | |
|---|---|---|
| G11C 16/04 | (2006.01) | |
| G11C 16/10 | (2006.01) | |
| G06F 11/20 | (2006.01) | |
| G11C 29/00 | (2006.01) | |
| G06F 11/16 | (2006.01) | |
| G11C 16/34 | (2006.01) | |

(52) U.S. Cl.
CPC ............. *G11C 16/10* (2013.01); *G06F 11/20* (2013.01); *G11C 29/74* (2013.01); *G06F 11/167* (2013.01); *G11C 16/3495* (2013.01)
USPC ........... 365/185.11; 365/185.09; 365/185.18; 365/185.28

(58) Field of Classification Search
USPC .............. 365/185.09, 185.11, 185.18, 185.28
See application file for complete search history.

(56) References Cited

U.S. PATENT DOCUMENTS

| | | |
|---|---|---|
| 6,259,639 B1 | 7/2001 | Hashizume |
| 6,456,528 B1 | 9/2002 | Chen |
| 2002/0010876 A1 | 1/2002 | Kliegelhofer et al. |
| 2004/0090847 A1* | 5/2004 | Takeuchi et al. .............. 365/200 |
| 2005/0122790 A1 | 6/2005 | Ueno et al. |
| 2005/0141312 A1 | 6/2005 | Sinclair et al. |
| 2006/0056321 A1 | 3/2006 | Kakihara |
| 2008/0247243 A1* | 10/2008 | Kang et al. ............... 365/189.07 |
| 2009/0106581 A1* | 4/2009 | Shinogi et al. .................... 714/5 |
| 2011/0107017 A1* | 5/2011 | Chen ............................. 711/103 |
| 2011/0238902 A1* | 9/2011 | Ishikawa et al. .............. 711/103 |

FOREIGN PATENT DOCUMENTS

| | | |
|---|---|---|
| EP | 2184741 | 5/2010 |
| JP | 7-248978 | 9/1995 |

* cited by examiner

*Primary Examiner* — Hoai V Ho
(74) *Attorney, Agent, or Firm* — Allen, Dyer, Doppelt, Milbrath & Gilchrist, P.A.

(57) ABSTRACT

A method for managing a non-volatile memory may include a first phase of writing data to a first bank of a memory plane of the non-volatile memory, and then a second phase of writing the same data to a second bank of the same memory plane of the non-volatile memory in the case of success of the first writing phase.

24 Claims, 9 Drawing Sheets

SECURE MEMORY WHICH REDUCES DEGRADATION OF DATA

FIELD OF THE INVENTION

The present application relates to electronic devices, and more particularly to an electrically programmable non-volatile memory which is robust against data corruption, such as during a phase of writing or programming, and/or reading. It also relates to a method for managing such a non-volatile memory, and an electronic device or system which includes at least one such electrically programmable memory.

BACKGROUND OF THE INVENTION

An electrically erasable and programmable memory (EEPROM) includes memory cells, each including a floating-gate transistor and an access MOS transistor, which are organized in a memory plane according to a matrix of n×m cells disposed in n rows (or lines) and m columns. Each memory cell is situated at the intersection of a word line and a bit line. In this structure, a set of memory cells connected to the same word line, in a row, is called a physical page of the memory. The memory plane of such a memory is a set of pages.

An example of a prior art EEPROM memory portion is shown in FIG. 1. More precisely, the memory portion includes two columns and four rows, with which four word lines $WL_i$ to $WL_{i+3}$ are associated. In each of these rows, each column includes eight bit lines (respectively BL0 to BL7 and BL8 to BL15) linked to eight memory cells. In this example, these eight cells disposed at each intersection of a column and a row thus form a memory byte.

An example of a prior art memory byte is shown in FIG. 2. Each memory cell of this byte, such as the cell $C_{i0}$, includes a floating-gate transistor FGT and an access transistor AT. The latter has its gate G connected to the word line $WL_i$, its drain D connected to a bit line $BL_0$, and its source S connected to the drain D of the floating-gate transistor FGT. The latter has its source connected to a source line LS and its control gate G connected to a gate control line $CGL_0$, by way of a gate control transistor $CGT_0$. The gate of gate control transistor $CGT_0$ is linked to the word line $WL_i$, whose drain D is connected to the gate selection line $CGL_0$, and whose source S is connected to a potential common to the eight control gates of the floating-gate transistors FGT. The gate selection line $CGL_0$ extends over all the pages of the memory plane, in a manner similar to the bit lines, and links the gates of the floating-gate transistors of each cell of the same column by way of the gate control transistor CGT. A source line LS extends in a similar manner to link the sources of each cell to the same source voltage, as explained previously.

In such a memory, each cell $C_{ij}$, may store a binary information item, which may be modified by a write operation. The write operating involves positively charging the floating gate of the transistor FGT. An erase operation involves negatively charging this floating gate. The operations of erasing or writing a memory cell, and more particularly the floating-gate transistor FGT of the cell, are accomplished using a tunnel effect (e.g., Fowler Nordheim effect), for example. As a result, an erased transistor FGT exhibits a greater threshold voltage than that of the programmed transistor. When a reading voltage Vread chosen between these two threshold voltage values is applied to the control gate of the transistor FGT, it remains off if it is in an erased state and on if it is in a programmed state. This makes it possible to detect its state and to associate with it a binary value representing a stored data bit.

According to one prior art approach, collective erasure of the transistors FGT is achieved by applying a voltage of 15 to 20 V to the control gate of the transistors FGT by way of the gate control transistor $CGT_0$, while the source line is at 0 and the drain of the transistors FGT is at a floating potential. The individual programming of the transistors FGT is achieved by applying the programming voltage Vpp to the drains of the transistors FGT via the access transistors AT, while the control gates of the transistors FGT are at 0 and the source line is at a floating potential.

A plane 1 of a prior art EEPROM memory is shown in FIG. 3, which includes eight columns of eight bits and 32 rows, i.e. a total of 2048 bits. Each word line $WL_i$ (not shown in FIG. 3) of the memory plane is controlled by a voltage signal delivered by an output of a line decoder RDEC. Each column selection line $CGL_j$ receives a voltage on the basis of a column latch (not shown) in cooperation with a column decoder CDEC. Likewise, each bit line $BL_j$ is linked to a programming latch (not shown) and to a column decoder CDEC, to send thereto the signal necessary for a desired operation. Each source line LS is connected to circuitry which brings it to the ground potential during an erase or read phase, or leaves it at a floating potential during a write phase. In this example, the memory plane thus includes several pages successively disposed over the various rows. Each page, including the page $P_i$ considered, therefore includes eight bytes, including the two bytes $O_{i0}$ and $O_{i1}$, which are disposed at the intersections of the row i with columns 0 and 1, and are each associated with a gate control line $CGL_0$, $CGL_1$.

In practice, a programmable memory such as the one described above is associated with a programming method which manages write commands to engender programming cycles, of which a prior step includes the definition of a start address for writing a certain data to the memory. This address includes of the definition of the write row involved, as well as the column at which the write begins. Thereafter, another prior step includes the activation of all the latches of bit lines whose bits are involved in the write to thereafter undertake the programming cycle. During the latter, all the necessary latches of the memory have been activated. Thereafter, each programming cycle first includes a cycle of erasing all the bits of the bytes involved in the write and then an actual write cycle, in which the programming potential Vpp of the memory is brought to its programming value. This ultimately allows the simultaneous and automatic programming of all the bits having to take the value "1", such as defined by the data to be stored. Through the previously described architecture, it is therefore apparent that each bit is independently programmable by acting specifically on the bit and word lines to which it is linked.

Such a prior art non-volatile memory may exhibit certain drawbacks. In particular, a risk exists of corruption of its data in certain circumstances, that is to say a risk that some of its data is accidentally modified, or poorly recorded or read. This may result in poor operation, or indeed a crash of the system in which this memory is installed. The particular circumstances which may lead to a corruption of the data of a memory may be linked with a phase of writing to this memory, such as a power outage, a crash of the memory controller, a computer virus or miscellaneous glitches which arise when the write phase is in full swing which may lead to a failure of all or part of the write operation (this being manifested by a corruption of the data). Moreover, this phenomenon may also arise outside of any memory write phase, simply through a modification of certain data during their retention on the memory, for example through degradation of certain transistors over time, too great a storage time, etc.

One prior art approach for at least partly addressing the problem of corruption of data of a non-volatile memory includes doubling up the memory devices, e.g., using duplicate EEPROM memories and associated components in a system, to store the same information in duplicate. This approach is expensive since it requires considerable redundant hardware, as well as complex management of several memories, e.g., by dedicated software. It also lengthens the processing time.

Another prior art approach uses a non-volatile memory integrated on a semiconductor, in which each memory bit is doubled up to likewise preserve data in duplicate. In this approach, the doubling is managed within the very structure of the memory, in an integrated manner. This approach thus slightly increases the size of the integrated circuit forming the memory, but does not significantly modify the remainder of the system, thereby reducing the increase in size and in cost overhead. In this approach, each bit is associated with a twin bit, arranged in such a way that the operation of the two twin bits is correlated with their programming being carried out simultaneously by the same control components. This structure therefore makes it possible to double up the information item stored without excessively increasing the overall size of a system, by doubling up a minimum of elements. In case of a failure of a memory bit over time, the data remains present on the second twin bit and may be recovered. However, this approach may exhibit a drawback that in the case of an accident during a write phase, the information item remains lost. Indeed, as the write is carried out simultaneously on the two twin bits, any failure impacts them in the same way. Such a memory then remains as vulnerable as the conventional memory described previously with reference to FIGS. 1-3 in relation to accidents in the write phase.

Thus, a need exists for an electrically programmable non-volatile memory which is less vulnerable to the risks of data corruption than the existing approaches.

SUMMARY OF THE INVENTION

An object of the invention is to provide a non-volatile memory that is less vulnerable to the previously mentioned risks of data corruption, while being compact, and lower in cost.

As such, a method for managing a non-volatile memory is characterized in that it may include secure data writing. The data writing may include a first phase of writing data to a first bank of a memory plane of the non-volatile memory, and then a second phase of writing the same data to a second bank of the same memory plane of the non-volatile memory in the case of success of the first writing phase.

The method may further include a prior step of comparing at least two twin bits of the two banks of the memory plane, and correcting a bit in the case of corrupted data.

The method may also include steps of reading twin bits of the two banks of the memory plane at an address chosen for writing, comparing these two twin bits, and activating the latch of the bit line of the first bank as a function of the future data to be written to the bits involved. A repair step may include activation of the latch of the bit line of the twin bit of the second bank to be able to write the same data to this second bank in the case of non-equality between the data subsequent to the comparison, and then incrementing a column pointer and repeating the prior steps until the whole of the data packet involved in the write has been processed.

The method may further include a phase of writing of the bits of the memory which includes a prior repair test, and then writing to the first bank only if no repair is necessary, or writing to correct the second bank before writing to the first bank if a repair is necessary.

The method may further include aligning the two banks of the memory plane, which includes reading the data of twin bits of the two banks in the column pointed at, comparing the read data, incrementing the column pointer in the case of equality between these data, and activating the bit line latch for the twin bit of the second bank in the case of non-equality between the data to be able to copy the data of the bit of the first bank to the second bank. These steps are repeated if the end of the bits involved in the alignment is not reached, and then writing to the second bank is performed if a correction has proved to be necessary.

The method may further include performing reading and verifying the state of the two banks of the memory plane which are involved in the reading to determine which bank to read.

The method may also include performing reading with correction of errors to remedy a corruption of data which might have arisen when retaining the data on the memory banks.

The method may also include an initial step of launching a secure writing mode, which includes declaring writing in a secure manner to the memory by a particular opcode, or transmitting a read opcode before reading the memory.

The method may further include storing two flags representing the state of each bank of the memory plane, taking a first value if a writing phase has terminated and a second value if a writing phase is in progress.

A memory plane for an electrically programmable non-volatile memory is also provided. The memory plane may include memory cells distributed in columns and rows, and a device for implementing the management method as described previously.

The memory plane may include two banks to store the same data in duplicate, each bit of the second bank being paired with a bit of the first bank. Two distinct latches may be used for activation of the distinct bit lines linked to the two paired bits of each bank.

The memory plane may further include, at the intersection of a row and of a column, a first byte belonging to the first bank and linked to first bit lines extending over the whole of the column, and a second byte belonging to the second bank and linked to second distinct bit lines extending over the whole of the column.

The memory plane may also include, at the intersection of a row and of a column, a gate control transistor for each byte and a shared source line for both bytes.

The memory plane may further include, at the intersection of a row and of a column, a first byte whose first bits are arranged in a mutually juxtaposed manner, then second bits of a second byte arranged in a mutually juxtaposed manner. The two bytes may be linked to a same word line extending over a whole row of the memory plane.

Each column of the memory plane may include column decoders, control latch blocks for the bit lines which each include two latches for activating two bit lines respectively for a bit of the first and of the second bank, and a control latch block for the gate control lines. The control latch block may include two latches for respectively activating an access transistor of the memory cells of the first and second banks.

Each column decoder may transmit three values to the control latch blocks for the bit lines to indicate the selection of the column and bank involved with respect to a programming or reading operation. Each column decoder may also transmit a value to the control latch block for the gate control lines to indicate the selection of the column.

An electrically programmable non-volatile memory is also provided, which may include at least one memory plane, such as the one described briefly above. The electrically programmable non-volatile memory may include a high-voltage generator which generates distinct voltage values for the control of the two banks of the memory plane.

An error correction block may be included to make it possible to detect a difference between the data of two twin bits of the memory, of the type carried out by simple exclusive OR logic, and/or to carry out secure writing of the same data on the two banks of the memory. The memory may be an EEPROM.

An electronic device or system is also provided, which may include at least one electrically programmable non-volatile memory, such as the one described briefly above.

BRIEF DESCRIPTION OF THE DRAWINGS

Objects, characteristics and advantages of the present invention will be set forth in detail in the following description of a particular mode of execution given without limitation in conjunction with the appended figures, among which.

In the various figures, similar reference numerals correspond to similar elements.

DETAILED DESCRIPTION OF THE PREFERRED EMBODIMENTS

The embodiments described herein relate to an integrated memory, taking the form of an integrated circuit, in which the bits are doubled up or duplicated and arranged to be able to receive data in duplicate, while offering sequential rather than simultaneous writing of data in duplicate, to allow the recovery of the data even in the case of an incident during writing.

Figure 1:
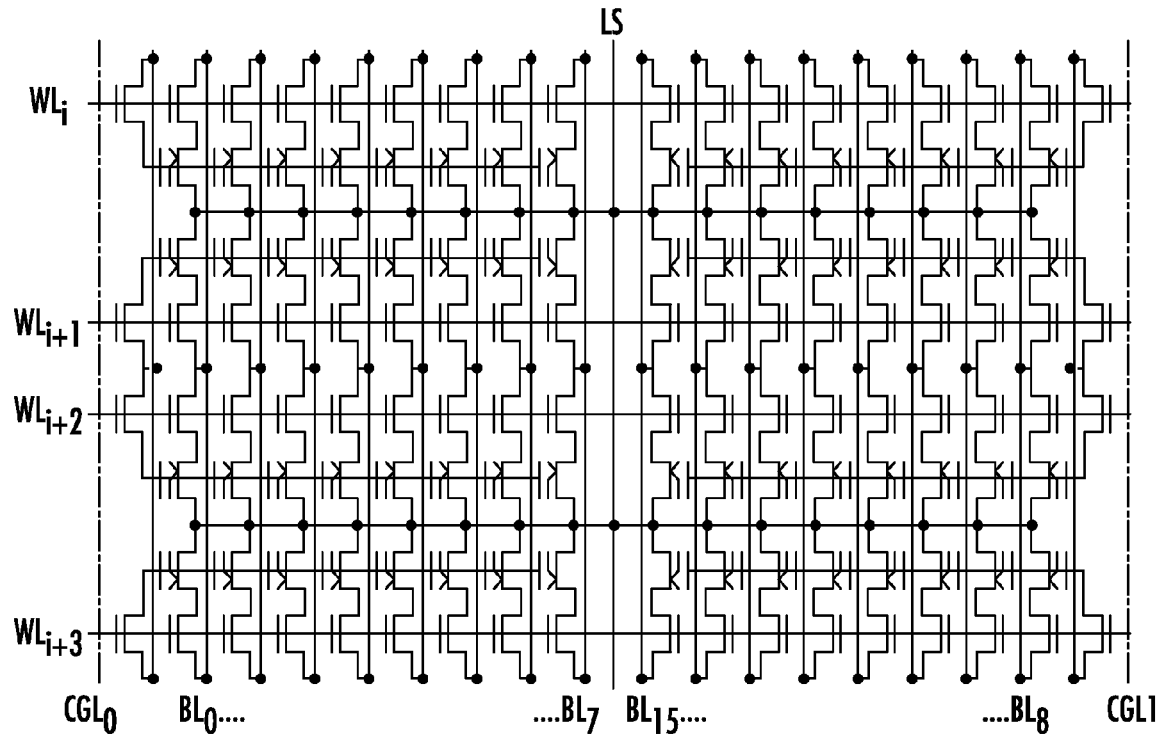
FIG. 1 is a schematic diagram representing a prior art electrically programmable memory portion.
Figure 2:
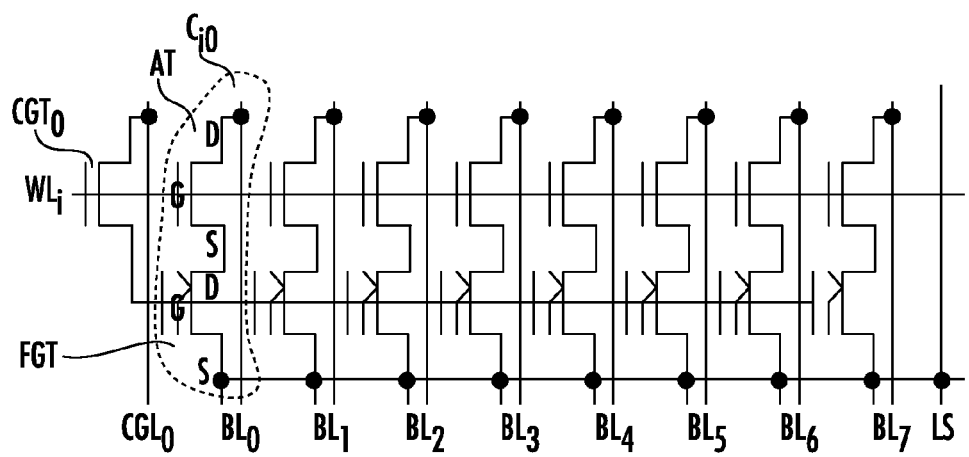
FIG. 2 is a schematic diagram of a byte of the electrically programmable memory of FIG. 1.
Figure 3:
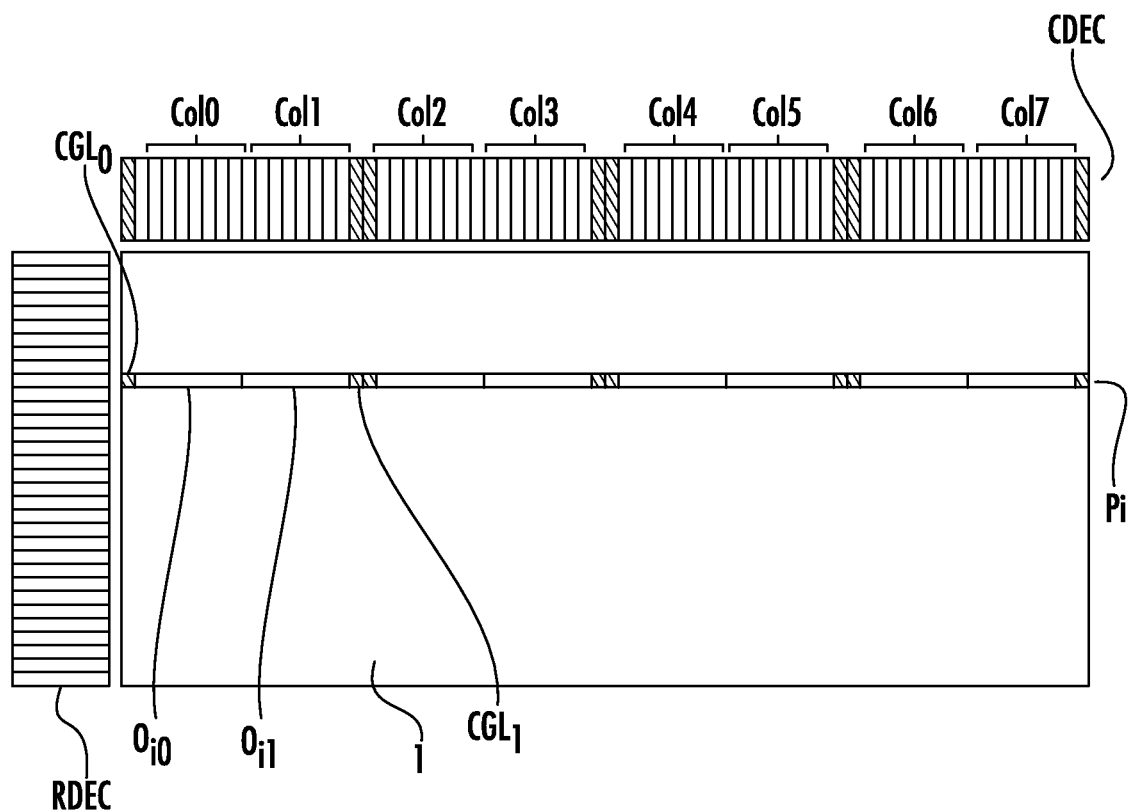
FIG. 3 is a schematic block diagram of a memory according to the prior art.
Figure 4:
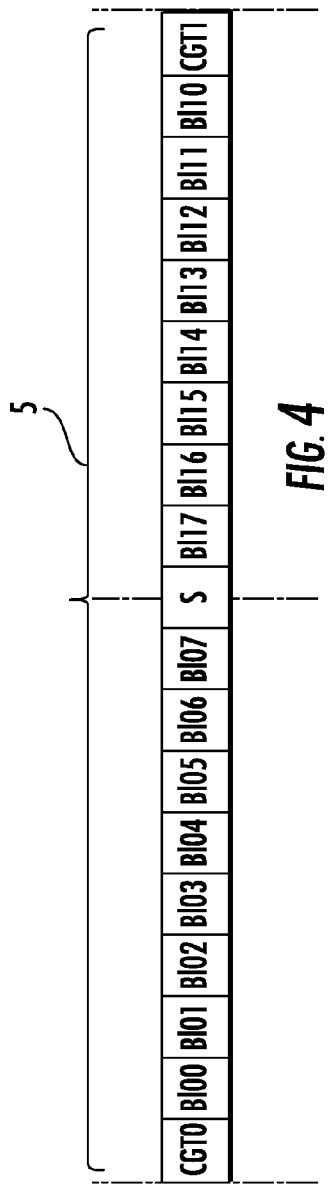
FIG. 4 is a schematic block diagram of an electrically programmable memory byte according to an embodiment of the invention.

An embodiment of a memory constructed according to this principle will now be described with reference to FIG. 4, which includes memory bits disposed at the intersection of a column and of a row of an EEPROM memory. At this intersection, the memory plane includes a first set of eight bits respectively linked to eight bit lines B100 to B107. This set moreover includes a gate control transistor $CGT_0$ linked with the various cells according to the principle discussed above with respect to FIG. 2. According to this embodiment, the column further includes in this same row a second set including eight bits respectively linked to eight bit lines B110 to B117, and a gate control transistor $CGT_1$ linked with the various cells according to the same principle discussed above with respect to FIG. 2. These two sets of eight bits are intended to store an information item in duplicate (i.e., redundant), which therefore correspond to a byte 5 in terms of storage capacity, and are considered to be a single memory byte in relation to the remainder of the memory. Each bit linked to a bit line B10$i$ is thus twinned or duplicated with the bit linked to the bit line B11$i$ of the second twin byte of the second bank.

These two bytes are linked to the same source line S. Their bits take a form similar to the structure shown in FIG. 2, and exhibit, in particular, MOS transistors which are arranged on an integrated circuit in a juxtaposed manner, in the order shown in FIG. 4. These two bytes are inter-linked, and are considered by the remainder of the memory as belonging to the same column, but to two different banks of the memory. They are disposed in the same row of the memory plane and linked to the same word line, which extends over a whole row of the memory plane, and over a whole page. The bytes of the second bank will serve for the storage of a copy of the data of the bits of the first bank, according to a sequential method of writing, as will be detailed below. These two bytes therefore serve for the storage of a single byte of data, i.e., they do not double the capacity of the memory but increase its security by remedying the problem of data corruption, as will be discussed further below.

Figure 5:
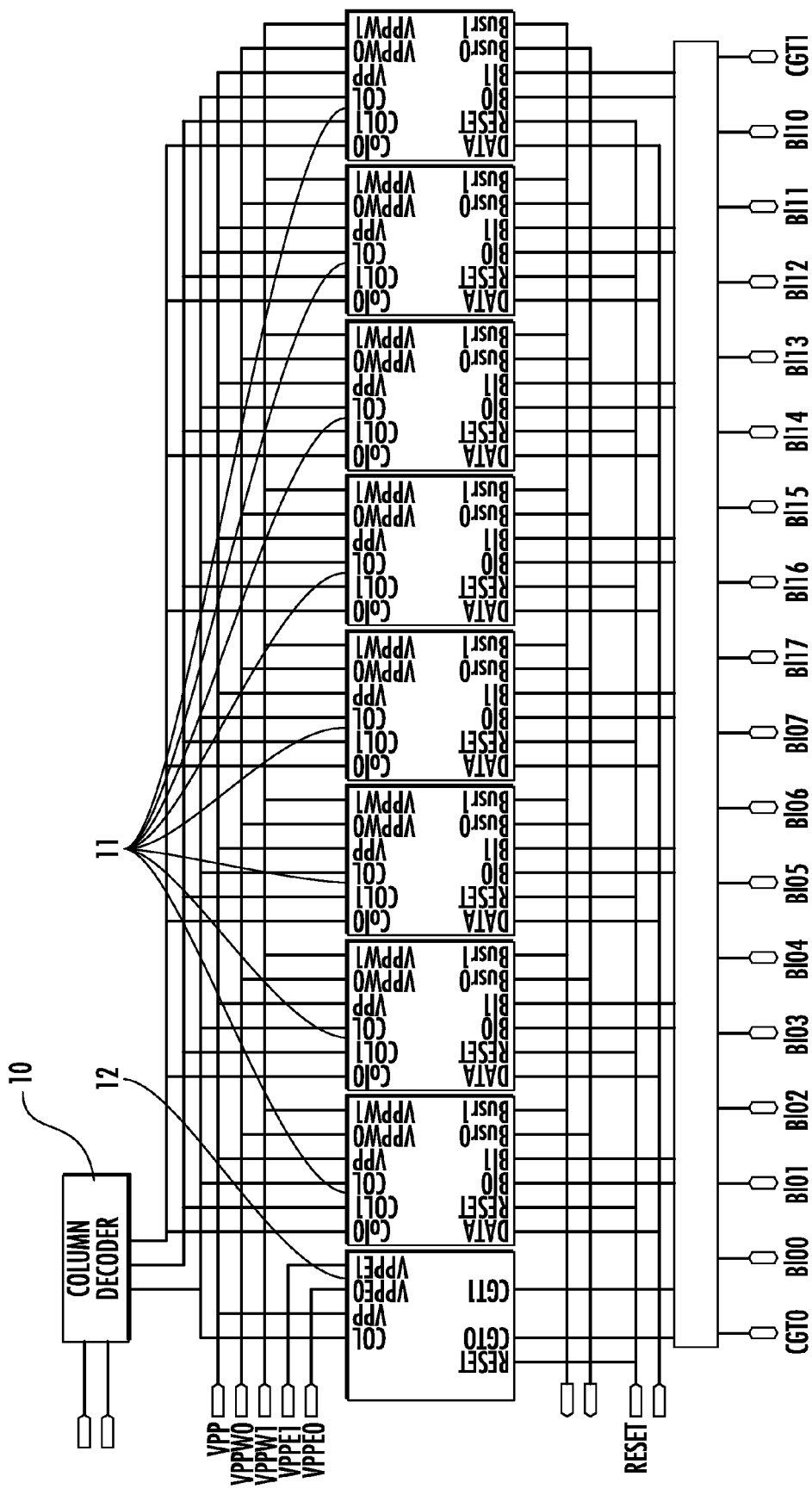
FIG. 5 is a schematic block diagram of an assembly of a memory according to an embodiment of the invention illustrating its operation.

FIG. 5 illustrates components for the control of a column of a memory plane according to an example embodiment. A column decoder 10 transmits as outputs three values COL, COL0 and COL1. The value COL serves to indicate the selection of the column for a programming or reading operation. The values COL0 and COL1 serve, respectively, to indicate the selection of bank 0 or bank 1 of the memory. These three values are distributed by various buses over eight control latch blocks for the bit lines 11 of the column. A control latch block for the gate control lines 12 linked to the access transistors of the column receives the value COL only. The eight control latch blocks for the bit lines 11 of the column moreover receive three voltage signals VPP, VPPW0, VPPW1, two signals Busr0, Busr1, a signal Data and a signal Reset, the role of which will be discussed below. The control latch block for the gate control lines 12 receives three voltage signals VPP, VPPE0, VPPE1, and a signal Reset. At their outputs, these latches may activate the sending of signals to bank 0 or to bank 1. Ultimately, these signals are directed towards the bit lines B100 to B107 and the access transistor CGT0 of the first bank 0, or towards the bit lines B110 to B117 and the access transistor CGT1 of the second bank 1.

Figure 7:
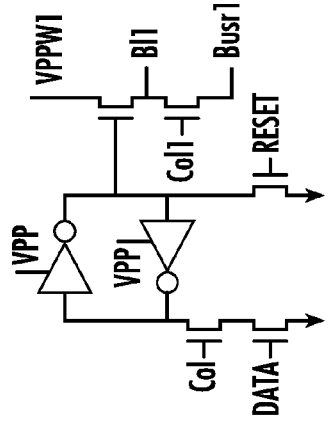
FIGS. 6 and 7 are schematic diagrams of latches of bit lines of an electrically programmable memory according to an embodiment of the invention.
Figure 6:
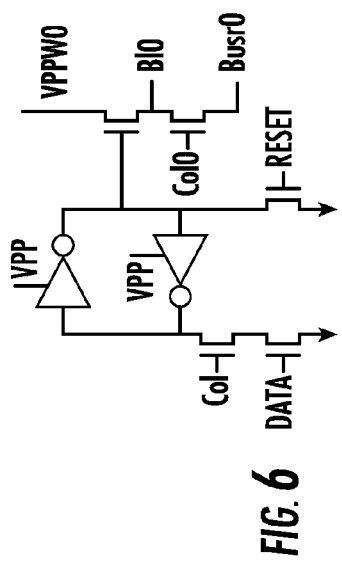

In the illustrated embodiment, each control latch block for the bit lines 11 includes two latches, of which an exemplary embodiment is illustrated in FIGS. 6 and 7. These two latches control, respectively, a bit line of the first and the second banks of the memory. As illustrated in these two figures, when the column considered is selected by way of the value Col, each latch makes it possible to link the bit line of the first bank B10 to a first programming voltage VPPW0 when the value of Col0 corresponds to a selection of the first bank 0, or to link the bit line of the second bank B11 to a second programming voltage VPPW1 when the value of Col1 corresponds to a selection of the second bank.

Figure 9:
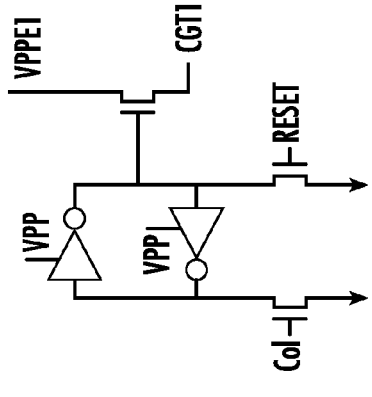
FIGS. 8 and 9 are schematic diagram of latches of gate control lines of an electrically programmable memory according to an embodiment of the invention.
Figure 8:
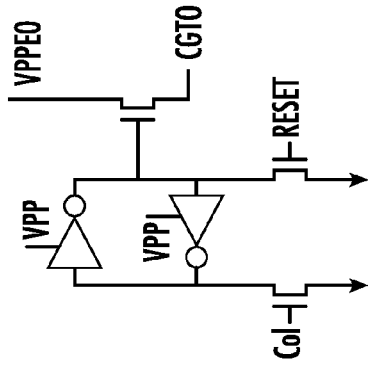

The control latch block for the gate control lines 12 likewise includes two latches, of which an exemplary embodiment is shown in FIGS. 8 and 9, which respectively control the access transistor of the memory cells of the first and the second banks. Each latch makes it possible to link the access transistor of the first and second banks to a respective voltage VVPE0, VPPE1 in the case of selection of the first or second bank as a function of the value Col.

Figure 10:
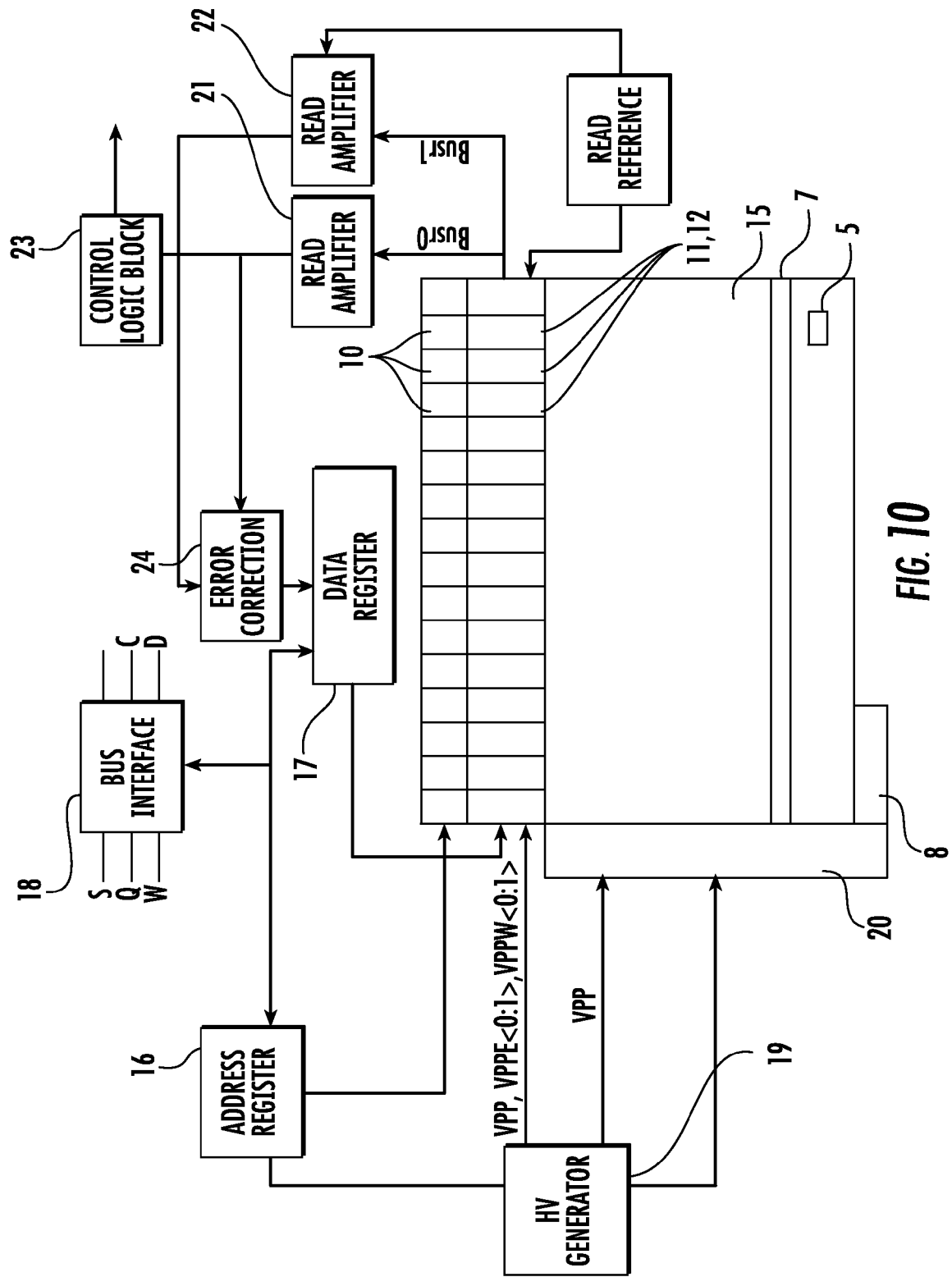
FIG. 10 is a schematic block diagram of an electrically programmable memory and its control components according to an embodiment of the invention.

A memory according to an example embodiment incorporating the elements described above is shown in FIG. 10. The memory plane 15 includes the various transistors forming the memory cells and the electrical connections in lines and columns, such as the bit lines, source lines, gate and word control lines, similar to those explained previously. The memory plane 15 integrates two data banks 0 and 1, which are obtained by doubling up each byte 5 in each column, as explained previously with regard to FIG. 4. It includes a succession of pages 7 extending over a whole row of the memory plane. Thereafter, each column is controlled by the latch blocks 11, 12 and the column decoder blocks 10 described above. Note that the memory plane includes a storage space 8 for data specific to the method for managing the memory plane, such as two flags F1, F2, as will be described below.

The memory plane 15 is linked to an address register 16 which transmits to the column decoders 10 and line decoders 20 the information on the addresses of the bits of the memory plane involved in a given operation. Moreover, a data register 17 transmits to the latch blocks the data to be written to the memory, which are identified by the label "data" in FIGS. 6 and 7. The data register 17 read-receives the data (Busr0, Busr1, reset, etc.), which pass through an error correction box 24 beforehand. In contrast to the prior art described above, the memory includes a high-voltage generator 19 which generates several voltage values, which are used for control of the two banks of the memory, as discussed previously, namely VET, VPPE0, VPPE1, VPPW0, and VPPW1.

The memory, moreover, includes two reading amplifiers 21, 22 for respectively reading bank 0 or bank 1, a control logic block 23 which interprets the commands (e.g., according to the SPI protocol), and an error correction box 24. The error correction box 24 makes it possible to detect an anomaly, i.e., a data corruption situation, in which two twin bits of the memory do not comprise the same datum. In the case of a storage of a datum "data", if the two bits do not comprise the same datum, a detection of this anomaly in the case where the device leads to a zero value in a corrupted cell may, for example, be carried out through a logic operation (e.g., exclusive OR). In the case of a correction, a logic OR operation may be used. The correction method implemented in such a situation will be described further below.

Figure 11:
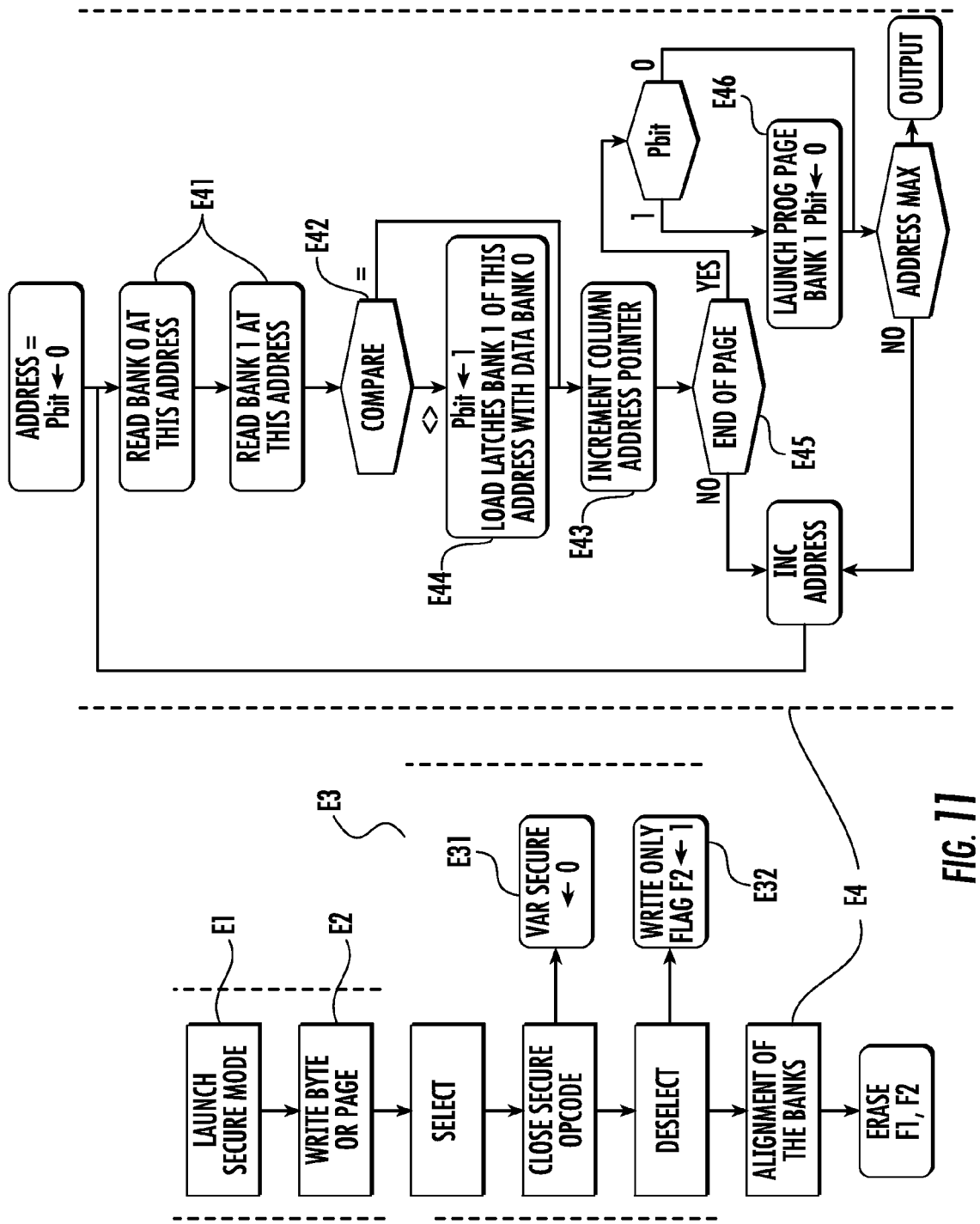
FIGS. 11 and 12 are flow diagrams of a method for managing writing in an electrically programmable memory according to an embodiment of the invention.
Figure 12:
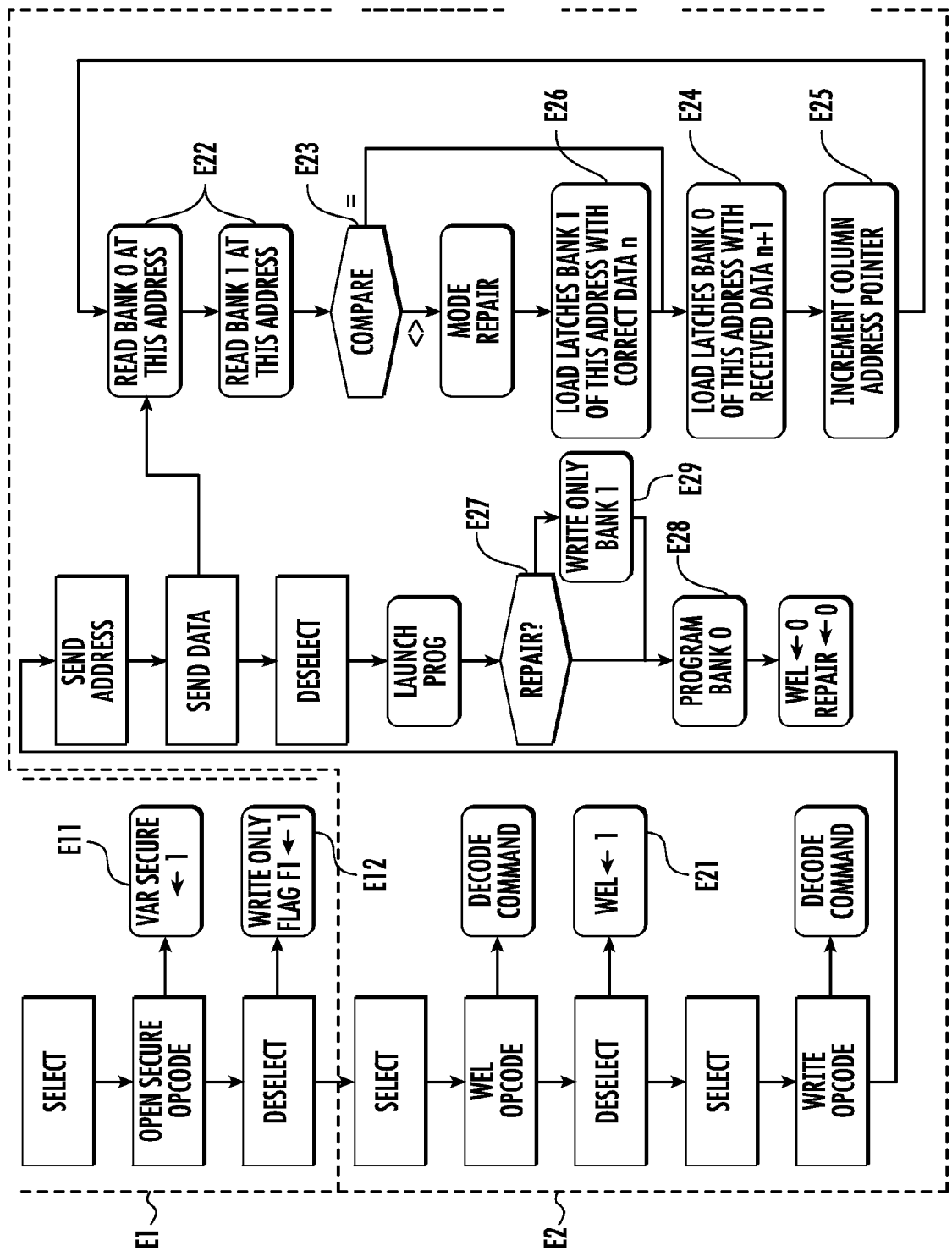

A method of writing to a memory such as the one described previously is now described with reference to FIGS. 11 and 12. According to one embodiment in which the commands are illustrated within the framework of the SPI protocol, by way of non-limiting example, the commands are thus given their standardized English terms (select, deselect, write, enable latch, etc.). This method is independent of the protocol chosen and may be implemented with other protocols. This method first includes a step E1 of launching a secure writing mode (FIG. 12).

The step E1 includes a sub-step E11 of declaring that all the future writes are to be made secure, until the explicit end of this secure writing mode, by a particular opcode. The volume of this data packet may correspond to a byte or a page, or another other predefined dimension. Moreover, a flag F1 is used, set by convention to the value 1 (sub-step E12), to signify that bank 0 of the memory is involved in the next write.

The writing method thereafter includes an writing step E2. This writing step may include the writing of a byte or an entire page. The first sub-step E21 positions a latch WEL ("Write Enable Latch") to the value 1, which enables writing to the memory according to the standard of the EEPROM memories operating on the SPI bus. Thereafter, a second sub-step E22 successively reads the twin bits of the banks 0 and 1 at the address chosen for the write. In the case of equality between these bits obtained in a comparison sub-step E23 (this being the normal situation in the absence of data corruption), the method continues with a sub-step of activating the latches E24 of the bank 0 of the column involved in the write, as a function of the future data to be written to the bits involved. To process these various bits and their latches in turn, the method includes a sub-step E25 of incrementing a column pointer, and the sub-steps E22 to E25 are repeated until the whole data packet involved in the write has been processed. In the case of detection of data corruption in sub-step E23, a repair sub-step E26 is instigated, which includes activating the latches of the bit lines of the twin bit of the bank 1 to be able to write the corrected datum to bank 1. This method thus allows bitwise correction of a storage error, if any, to remedy a data corruption, before a new data write.

Thereafter, when all the memory latches involved in the write have been activated by the previous sub-steps, the actual writing of the bits of the memory is instigated. Two cases are possible, according to a test performed in the repair test sub-step E27. In the first case for which no corruption of data has been detected, bank 0 alone is written in the writing sub-step E28. In the second case for which a corruption of data has been detected, and which may be carried out with the aid of a binary parameter Repair which takes the value 1 in the case of a repair being necessary (0 otherwise), bank 1 is first corrected in a correction writing sub-step E29 to obtain its correction before the writing of bank 0. In the exemplary embodiment, the defective state is regarded as an erased state, and the repair cycle may include a writing cycle only, and not a complete programming cycle (erase then write), thereby making it possible to save time. At the end of this writing step, bank 1 is will therefore include all the data stored previously, without data corruption. Bank 0 stores all the new data. At the end of this writing step E2, the variables Repair and WEL are reset to zero.

The writing method then includes a step E3 of closing the secure mode, which is implemented by the control circuit, in which a first sub-step E31 transmits the opcode of end of secure writing. A second sub-step E32 changes a second flag F2 from the value 0 to 1 to signify that the writing of bank 1 of the memory will now be considered.

Thereafter, a step E4 involves aligning the banks 0, 1, the objective of which is to also write the new data to bank 1 of the memory, to ultimately obtain a perfect image of bank 0, and therefore a doubling up of the data stored in the memory to be able to avoid data corruption, if any. Note, at the start of this alignment step, the two flags F1 and F2 are at the value 1. Thus, a sub-step E41 successively reads the data of banks 0 and 1 of a bit of the column pointed at, corresponding to the address chosen for the write. In the case of equality between the data, which is determined in a comparison sub-step E42, the method continues through a sub-step E43 of incrementing the column pointer. In the case of non-equality during the comparison sub-step E42, a sub-step E44 positions the latch of bank 1, which corresponds to the twin bit of bank 0, for a future write of the data of bank 0. These steps are repeated for all the memory bits involved in the write. A sub-step E45 detects the end of the bits involved in the write (e.g., the end of the page), as illustrated, or the end of a byte. A sub-step E46 of writing to bank 1 is then launched. At the end of this writing and of the alignment of the two banks 0, 1, the two flags F1 and F2 are reset to zero and bank 1 therefore has the same data as bank 0.

Figure 13:
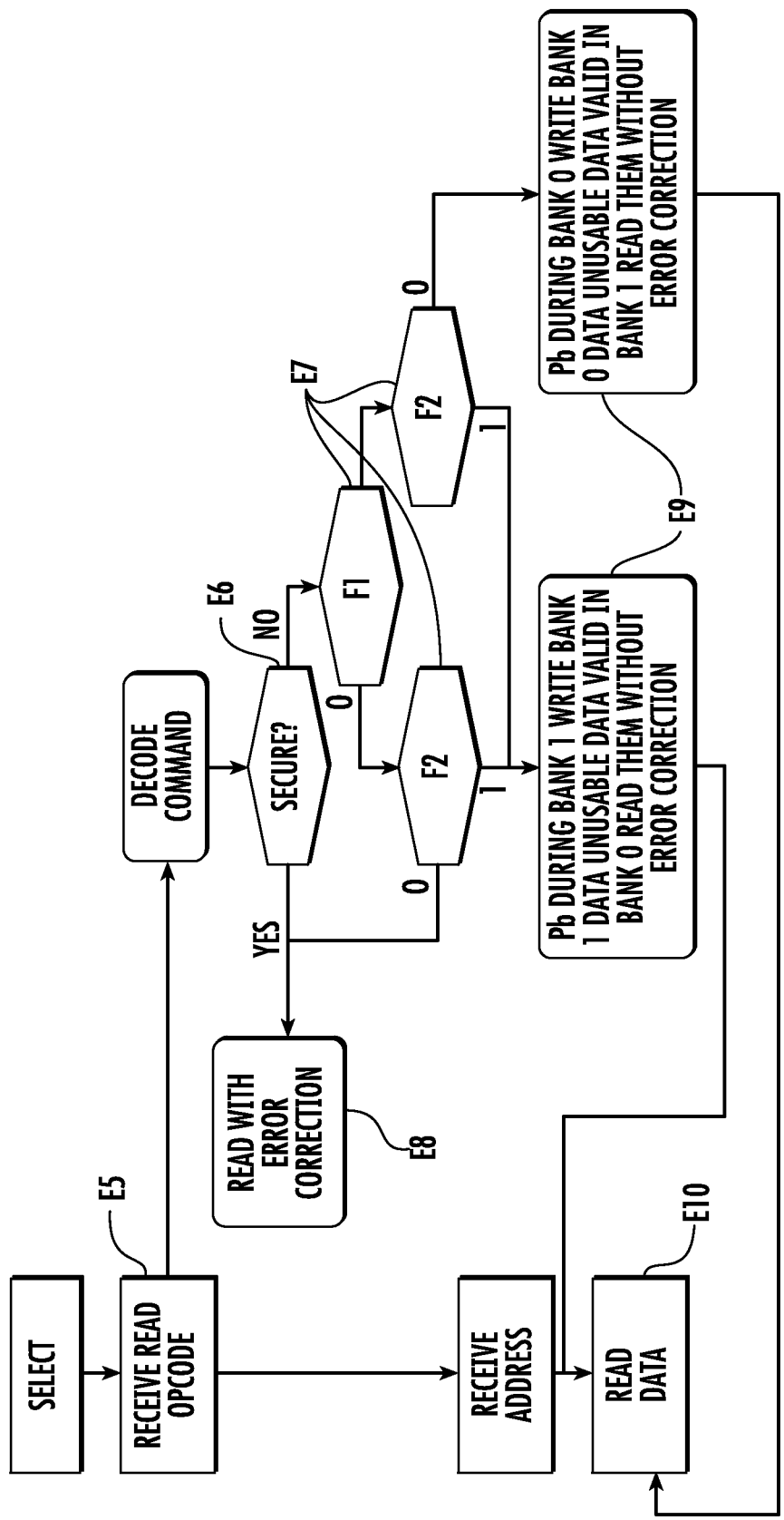
FIG. 13 is a flow diagram of a method for managing reading in an electrically programmable memory according to an embodiment of the invention.

A method for reading a memory according to an example embodiment is now described with reference to FIG. 13. This method includes a step E5 of transmitting a read opcode. A test is then performed to determine whether the read instigated is implemented with an error correction procedure, in a secure reading test step E6. If the response is negative, a step of verifying the value of the flags F1, F2 makes it possible to determine the bank to be read from among the two available banks 0, 1. These flags indicate the state of the banks and whether or not their corresponding data are utilizable. Thus, the testing of these flags E7 makes it possible to choose in step E9 which bank to read from among the two banks 0, 1. If the response to the secure reading test E6 is positive, and if the test of the flags of step E7 shows that the two flags F1, F2 are at 0, a step E8 of reading with correction of errors is implemented to remedy any corruption of data which might have arisen when retaining the data on the banks. This reading with correction of errors rests upon a combination of the contents of the two banks of the memory, by comparison of the twin bits of each bank. This is done, for example, by a step of using a bitwise OR logic operator between the twin data of each bank. A step E10 of reading the data at the chosen address may then be implemented on the bank chosen for the reliability of its data.

Figure 14:
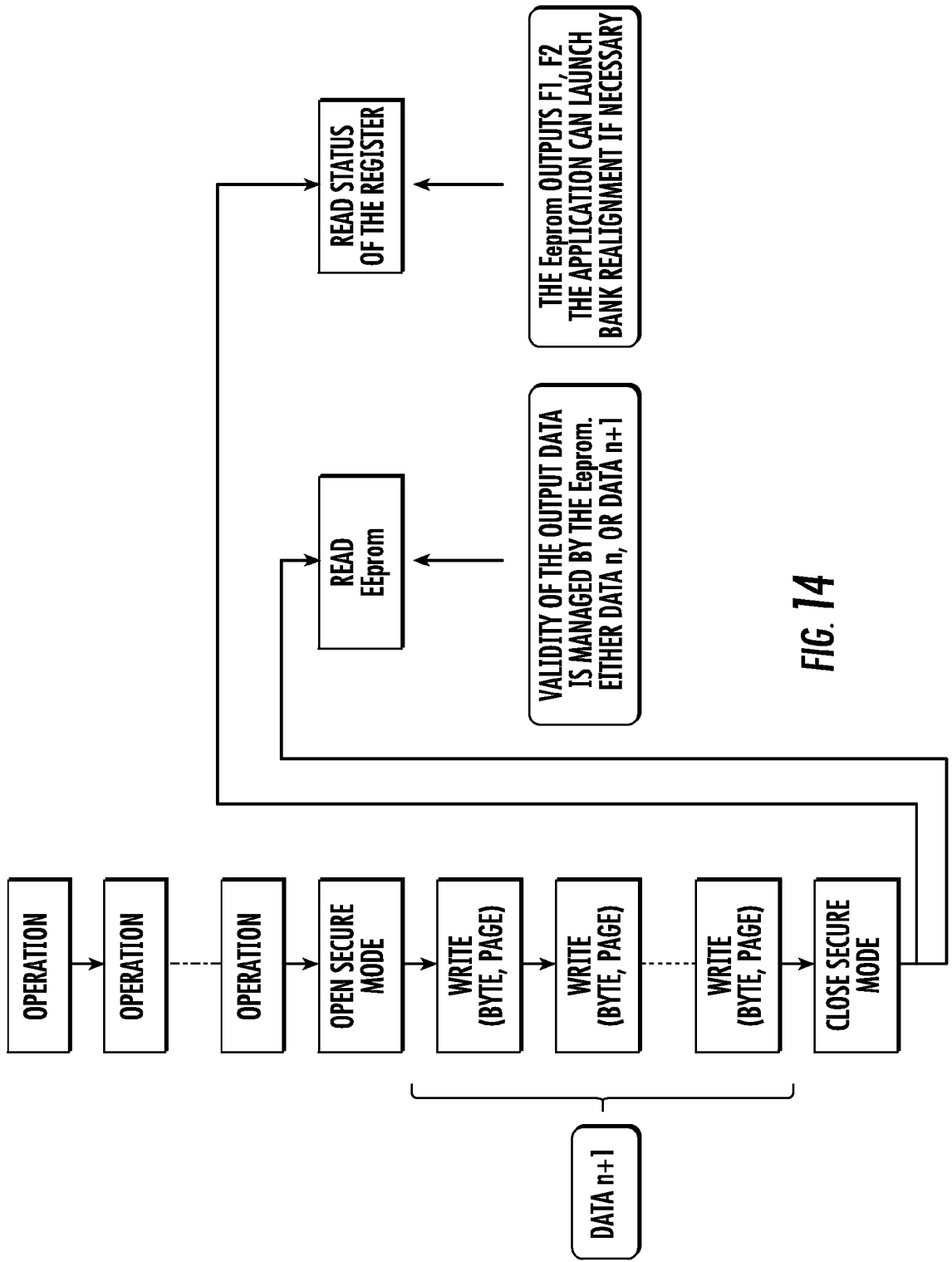
FIG. 14 is a flow diagram of a method for managing an electrically programmable memory according to an embodiment of the invention.

A method for managing a memory according to an exemplary embodiment is now described with reference to FIG. 14. The method includes a customary use of the memory in "operation" steps, and then a secure mode in which the writing of new data is implemented, according to the writing method described previously with reference to FIGS. 11 and 12. The memory stores two flags F1, F2, which may be consulted. These flags give an indication about the state of each bank of the memory. That is, they make it possible to launch a method for aligning the banks if needed, according to step E4 described previously. Thereafter, the data stored by the memory will not be corrupted. The memory ultimately has either new written data, or, in the case of failure of this new write, the data present before the failed write attempt. The memory therefore does not store any partially valid data, such as corrupted data which risks bringing about a system failure. It makes it possible, for example, to avoid rendering an entire system unusable if a software update is simply interrupted.

The method for managing the electronic memory has been presented with reference to a memory whose architecture is set forth above. However, this architecture has been described by way of example and in a non-limiting manner. Other embodiments may be used in some implementations, e.g., another organization of the two banks within the memory, i.e., another organization of the twin bits on the same integrated circuit, and/or another management approach for the bits of the memory allowing sequential alignment of the data on two distinct banks. The two twin bytes of the two banks need not be juxtaposed and/or not be symmetric. Each twin byte's bits may also be distributed differently, in a non-ordered and/or non-symmetric manner. Furthermore, this approach has been described for a non-volatile EEPROM memory, but it may also be implemented in another type of electronic memory as well.

A secure memory, such as the one described above, may be advantageously be utilized in numerous systems, such as computers, electronic daughter cards, digital cameras, multimedia accessories, automobile components, etc.

That which is claimed is:

1. A method for operating a non-volatile memory comprising a memory plane having first and second banks of non-volatile memory cells for storing redundant data, the method comprising:
   entering a secure writing mode based upon a write opcode;
   after entering the secure writing mode, performing a first phase of writing the redundant data to the first bank of the memory plane;
   if the first phase of writing the redundant data is successful, performing a second phase of writing the redundant data to the second bank of the memory plane; and
   reading data from at least one of the first and second banks based upon a read opcode.

2. The method of claim 1 further comprising:
   comparing at least two corresponding bits of the redundant data from the first and second banks to determine data corruption; and
   performing data correction based upon a determination of data corruption.

3. The method of claim 1 wherein the non-volatile memory comprises a column pointer; wherein the first bank and the second bank each comprises a respective bit line and associated latch; and further comprising:
   (a) reading and comparing corresponding bits of the first and second banks at a given write address to determine if they are equal;
   (b) activating the latch of the bit line of the first bank based upon data to be written;
   (c) activating the latch of the bit line of the second bank to write the corresponding redundant data to the second bank based upon a non-equality between the corresponding bits; and
   (d) incrementing the column pointer and repeating steps (a)-(c) until writing of the redundant data is complete.

4. The method of claim 1 further comprising:
   testing the redundant data to be written to the first bank to determine if a repair is necessary prior to performing the first phase of writing; and
   if a repair is necessary, writing corrective data to the second bank prior to performing the first phase of writing.

5. The method of claim 1 wherein the non-volatile memory comprises a column pointer; wherein the first bank and the second bank each comprises a respective bit line and associated latch; and further comprising:
   (a) reading the redundant data of corresponding bits of the first and second banks in a column;
   (b) comparing the corresponding bits to determine equality therebetween;
   (c) incrementing the column pointer based upon a determination of equality between the compared bits;
   (d) activating the bit line latch for the bit of the second bank based upon a determined non-equality between compared bits to copy the bit stored in the first bank to the second bank; and
   (e) repeating steps (a)-(d) for other corresponding bits of the first and second banks.

6. The method of claim 1 further comprising verifying a state of the first and second banks.

7. The method of claim 1 further comprising storing respective flags in the memory representing respective states of the first and second banks, wherein a first value of the flags corresponds to a writing phase having been terminated and second value of the flags corresponds to a writing phase in progress.

8. A memory plane for a non-volatile memory comprising:
first and second banks of non-volatile memory cells configured to store redundant data; and
a controller cooperating with the first and second banks and configured to
enter a secure writing mode based upon a write opcode,
after entering the secure writing mode, perform a first phase of writing the redundant data to the first bank of the memory plane,
if the first phase of writing the redundant data is successful, perform a second phase of writing the redundant data to the second bank of the memory plane, and
read data from at least one of the first and second banks based upon a read opcode.

9. The memory plane of claim 8 wherein said controller is configured to cooperate with said first and second banks to compare at least two corresponding bits of the redundant data from the first and second banks to determine data corruption, and to perform data correction based upon a determination of data corruption.

10. The memory plane of claim 8 wherein said controller is configured to implement a column pointer; wherein said first bank and said second bank each comprises a respective bit line and associated latch; and wherein said controller is configured to cooperate with said first and second banks to
(a) read and compare corresponding bits of the first and second banks at a given write address to determine if they are equal;
(b) activate the latch of the bit line of the first bank based upon data to be written;
(c) activate the latch of the bit line of the second bank to write the corresponding redundant data to the second bank based upon a non-equality between the corresponding bits; and
(d) increment the column pointer and repeating steps (a)-(c) to complete until writing of the redundant data is complete.

11. The memory plane of claim 8 wherein said controller is configured to cooperate with said first and second banks to test the redundant data to be written to the first bank to determine if a repair is necessary prior to performing the first phase of writing and, if a repair is necessary, write corrective data to the second bank prior to performing the first phase of writing.

12. The memory plane of claim 8 wherein said controller is configured to implement a column pointer; wherein said first bank and said second bank each comprises a respective bit line and associated latch; and wherein said controller is configured to
(a) read the redundant data of corresponding bits of the first and second banks in a column;
(b) compare the corresponding bits to determine equality therebetween;
(c) increment the column pointer based upon a determination of equality between the compared bits;
(d) activate the bit line latch for the bit of the second bank based upon a determined non-equality between compared bits to copy the bit stored in the first bank to the second bank; and
(e) repeat steps (a)-(d) for other corresponding bits of the first and second banks.

13. A memory comprising:
at least one a memory plane comprising first and second banks of non-volatile memory cells configured to store redundant data and a controller cooperating with the first and second banks and configured to
enter a secure writing mode based upon a write opcode;
after entering the secure writing mode, perform a first phase of writing the redundant data to the first bank of the memory plane,
if the first phase of writing the redundant data is successful, perform a second phase of writing the redundant data to the second bank of the memory plane, and
read data from at least one of the first and second banks based upon a read opcode.

14. The memory of claim 13 wherein said controller is also configured to cooperate with said first and second banks to compare at least two corresponding bits of the redundant data from the first and second banks to determine data corruption, and perform data correction based upon a determination of data corruption.

15. The memory of claim 13 wherein said controller is further configured to implement a column pointer; wherein said first bank and said second bank each comprises a respective bit line and associated latch; and wherein said controller is configured to cooperate with said first and second banks to
(a) read and compare corresponding bits of the first and second banks at a given write address to determine if they are equal;
(b) activate the latch of the bit line of the first bank based upon data to be written;
(c) activate the latch of the bit line of the second bank to write the corresponding redundant data to the second bank based upon a non-equality between the corresponding bits; and
(d) increment the column pointer and repeating steps (a)-(c) to complete until writing of the redundant data is complete.

16. The memory of claim 13 wherein said controller is configured to cooperate with said first and second banks to test the redundant data to be written to the first bank to determine if a repair is necessary prior to performing the first phase of writing and, if a repair is necessary, write corrective data to the second bank prior to performing the first phase of writing.

17. The memory of claim 13 wherein said controller is further configured to implement a column pointer; wherein said first bank and said second bank each comprises a respective bit line and associated latch; and wherein said controller is configured to cooperate with said first and second banks to
(a) read the redundant data of corresponding bits of the first and second banks in a column;
(b) compare the corresponding bits to determine equality therebetween;
(c) increment the column pointer based upon a determination of equality between the compared bits;
(d) activate the bit line latch for the bit of the second bank based upon a determined non-equality between compared bits to copy the bit stored in the first bank to the second bank; and
(e) repeat steps (a)-(d) for other corresponding bits of the first and second banks.

18. The memory of claim 13 further comprising a voltage generator coupled to said at least one memory plane and configured to generate a plurality of different voltage levels.

19. The memory of claim 13 wherein said at least one memory plane comprises at least one electrically erasable programmable read-only memory (EEPROM) memory plane.

20. The memory of claim 13 wherein said at least one memory plane comprises at least one at least one electrically programmable non-volatile memory plane.

21. An electronic device comprising:
- at least one memory comprising at least one a memory plane;
- said at least one memory plane comprising first and second banks of non-volatile memory cells configured to store redundant data and a controller cooperating with the first and second banks and configured to
  - enter a secure writing mode based upon a write opcode;
  - after entering the secure writing mode, perform a first phase of writing the redundant data to the first bank of the memory plane,
  - if the first phase of writing the redundant data is successful, perform a second phase of writing the redundant data to the second bank of the memory plane, and
  - read data from at least one of the first and second banks based upon a read opcode.

22. The electronic device of claim 21 wherein said controller is also configured to cooperate with said first and second banks to compare at least two corresponding bits of the redundant data from the first and second banks to determine data corruption, and perform data correction based upon a determination of data corruption.

23. The electronic device of claim 21 wherein said controller is also configured to cooperate with said first and second banks to test the redundant data to be written to the first bank to determine if a repair is necessary prior to performing the first phase of writing and, if a repair is necessary, write corrective data to the second bank prior to performing the first phase of writing.

24. The electronic device of claim 21 wherein said at least one memory plane comprises at least one electrically erasable programmable read-only memory (EEPROM) memory plane.

* * * * *

UNITED STATES PATENT AND TRADEMARK OFFICE
CERTIFICATE OF CORRECTION

| | | |
|---|---|---|
| PATENT NO. | : 8,964,471 B2 | Page 1 of 1 |
| APPLICATION NO. | : 13/668448 | |
| DATED | : February 24, 2015 | |
| INVENTOR(S) | : Tailliet | |

It is certified that error appears in the above-identified patent and that said Letters Patent is hereby corrected as shown below:

In the Claims

Column 11, Line 42    Delete: "to complete"

Column 12, Line 2    Delete: "one a memory"
                     Insert: --one memory--

Column 12, Line 38    Delete: "to complete"

Column 13, Line 6    Delete: "at least one at least one"
                     Insert: --at least one--

Column 13, Line 9    Delete: "one a memory"
                     Insert: --one memory--

Signed and Sealed this
Eighteenth Day of August, 2015

Michelle K. Lee
*Director of the United States Patent and Trademark Office*